United States Patent
Racz et al.

(10) Patent No.: US 7,375,507 B2
(45) Date of Patent: May 20, 2008

(54) ASSEMBLY GROUP FOR CURRENT MEASUREMENT

(75) Inventors: Robert Racz, Zug (CH); Samuel Huber, Zurich (CH)

(73) Assignee: Melexis Technologies SA, Bevaix (CH)

( * ) Notice: Subject to any disclaimer, the term of this patent is extended or adjusted under 35 U.S.C. 154(b) by 0 days.

(21) Appl. No.: 11/542,329

(22) Filed: Oct. 3, 2006

(65) Prior Publication Data

US 2007/0080676 A1   Apr. 12, 2007

(30) Foreign Application Priority Data

Oct. 8, 2005   (CH) ..................... 1639/05

(51) Int. Cl.
*G01R 15/20* (2006.01)
(52) U.S. Cl. ................................. 324/117 H
(58) Field of Classification Search ............ 324/117 R, 324/117 H, 127, 251; 338/32 H
See application file for complete search history.

(56) References Cited

U.S. PATENT DOCUMENTS

| | | | |
|---|---|---|---|
| 4,559,495 A | 12/1985 | Lienhard | 324/117 |
| 4,782,375 A | 11/1988 | Popiovic | 357/27 |
| 5,041,780 A * | 8/1991 | Rippel | 324/117 H |
| 5,057,890 A | 10/1991 | Falk | 357/27 |
| 5,942,895 A | 8/1999 | Popovic et al. | 324/251 |
| 6,184,679 B1 * | 2/2001 | Popovic et al. | 324/251 |
| 6,512,359 B1 * | 1/2003 | Tamai et al. | 324/117 R |
| 6,542,068 B1 * | 4/2003 | Drapp et al. | 338/32 H |
| 6,759,841 B2 * | 7/2004 | Goto et al. | 324/117 H |
| 2004/0018644 A1 * | 1/2004 | Johnson et al. | 436/526 |
| 2005/0045359 A1 * | 3/2005 | Doogue et al. | 174/52.1 |

FOREIGN PATENT DOCUMENTS

| | | |
|---|---|---|
| DE | 197 41 417 A1 | 4/1999 |
| DE | 200 17 512 U1 | 3/2001 |
| DE | 100 49 071 A1 | 4/2002 |
| DE | 100 51 160 A1 | 5/2002 |
| DE | 100 54 016 A1 | 5/2002 |
| DE | 101 10 254 A1 | 9/2002 |
| DE | 102 43 645 A1 | 6/2004 |
| EP | 0 061 520 | 10/1982 |
| EP | 0 415 439 A2 | 3/1991 |
| EP | 1 111 693 A2 | 6/2001 |
| EP | 1 443 332 A1 | 8/2004 |
| JP | 5-223849 | 2/1992 |
| WO | WO 99/09566 | 2/1999 |
| WO | WO 99/60416 | 11/1999 |
| WO | WO 01/23899 A1 | 4/2001 |

* cited by examiner

*Primary Examiner*—Ha Tran Nguyen
*Assistant Examiner*—Joshua Benitez
(74) *Attorney, Agent, or Firm*—McCormick, Paulding & Huber LLP (57) ABSTRACT

An assembly group for current measurement comprises a conductor plate with three cuts and a measuring element placed on the conductor plate that has a difference sensor formed from two magnetic field sensors. By means of the three cuts a first and a second conductor section are formed in the conductor plate, wherein the current direction in the second conductor section runs opposite to the current direction in the first conductor section. The first magnetic field sensor is located above the first conductor section and the second magnetic field sensor is located above the second conductor section. The magnetic field sensors are sensitive to a magnetic field that runs parallel to the surface of the conductor plate and orthogonal to the current direction in the two conductor sections.

14 Claims, 5 Drawing Sheets

# ASSEMBLY GROUP FOR CURRENT MEASUREMENT

PRIORITY CLAIM

Applicant hereby claims foreign priority under 35 U.S.C § 119 from Swiss Application No. 1639/05 filed on Oct. 8, 2005, the disclosure of which is herein incorporated by reference.

FIELD OF THE INVENTION

The invention concerns an assembly group for current measurement.

BACKGROUND OF THE INVENTION

Touchless measurement of current with Hall elements is used for many applications, for example in electricity meters or for the measurement of the current fed to or taken from a battery. The Hall element measures the magnetic field created by the current. In order to reduce the influence of magnetic interference fields that originate from other magnetic field sources shields of ferromagnetic material are used in many cases. Because such shields are often too little efficient and an improvement of the shielding is difficult and, if at all, only with high effort devices with a u- or s-shaped conductor and two Hall elements have been developed, wherein the magnetic field created by the current at the locations of the two Hall elements points in directions running opposite to each other. Therefore the current creates in the two Hall elements Hall voltages with opposite sign, whereas an external interference field produces Hall voltages with the same sign. Such devices are known from international patent applications WO 99/60416 and WO 01/23899. Because the Hall elements have to be placed within the cuts of the u- or s-shaped conductor it is not possible to integrate both Hall elements on a single semiconductor chip. For this reason the assembly of the individual components is extensive and complicated. Furthermore the sensitivity is relatively small.

SUMMARY OF THE INVENTION

The object of the invention is to develop a solution for current measurement providing a small overall size, that is robust against mounting tolerances, external interference fields and temperature changes, has a high bandwidth and enables a simple and economic assembly.

The solution is an assembly group for current measurement comprising a conductor plate and a measuring element. The measuring element consists of a housing with electrical terminals. A semiconductor chip with magnetic field sensitive sensing elements is embedded in the housing. The conductor plate has three cuts. The first and third cut start at a first edge of the conductor plate. The second cut starts at an opposing second edge of the conductor plate and is arranged between the first and third cut. By means of the cuts a first and a second conductor section are formed in the conductor plate, wherein the current direction in the second conductor section is opposite (antiparallel) to the current direction in the first conductor section. The magnetic field sensitive sensing elements form two magnetic field sensors. The two magnetic field sensors are sensitive to a component of the magnetic field that runs parallel to the surface of the conductor plate (and also to the active surface of the semiconductor chip) and orthogonally to the current direction in the first conductor section. The measuring element is placed in the area of the second cut on the conductor plate and such that the first magnetic field sensor is located above the first conductor section and the second magnetic field sensor above the second conductor section. The current flowing through the first conductor section produces a magnetic field at the location of the first magnetic field sensor that essentially runs parallel to the surface of the conductor plate and orthogonally to the current direction. The current flowing through the second conductor section produces a magnetic field at the location of the second magnetic field sensor that also essentially runs parallel to the surface of the conductor plate and orthogonally to the current direction. The direction of the magnetic field at the location of the first magnetic field sensor runs opposite to the direction of the magnetic field at the location of the second magnetic field sensor because the current in the second conductor section flows in the opposite direction as the current in the first conductor section. The two magnetic field sensors are operated as difference sensor so that their wanted signals add.

With a preferred embodiment the magnetic field sensitive sensing elements comprise magnetic field concentrators arranged on the active surface of the semiconductor chip and Hall elements integrated into the active surface of the semiconductor chip. The magnetic field concentrators serve for the amplification and concentration of the component of the magnetic field to be measured at the location of the Hall elements.

The magnetic field concentrators turn the magnetic field locally by 90°. The current flowing in the conductor plate produces for example a magnetic field that points approximately into the x-direction in the area of the first magnetic field sensor. The magnetic field concentrators turn this magnetic field locally by 90° so that it points at certain locations of its edges into the z-direction, wherein x and z designate the axis of a Cartesian coordinate system. The Hall element is either a horizontal Hall element that is arranged below the edge of the magnetic field concentrator or a vertical Hall element that is arranged laterally displaced adjacent to the edge of the magnetic field concentrator where the turned magnetic field lines run already again into the x-direction. The terms "horizontal Hall element" and "vertical Hall element" are used as in the pertinent literature: Vertical Hall elements have at least three, generally four or five electrical contacts arranged along a straight line. Such vertical Hall elements are for example known from the U.S. Pat. Nos. 4,782,375 and 5,057,890. Horizontal Hall elements are sensitive to the component of the magnetic field that impinges vertically onto their active surface, whereas vertical Hall elements are sensitive to the component of the magnetic field that runs parallel to their active surface and ortogonally to the straight line with the contacts.

Hall elements show an offset which manifests itself as a Hall voltage different from zero although the magnetic field disappears. In order to reduce the offset different solutions are known, like in particular the combination of several Hall elements with which the supply currents flow in different directions or the so-called "Spinning current method" with which the current and voltage contacts of the Hall element are exchanged cyclically, as well as the combination of both solutions. The term "Hall element" has to be understood to include also such a combination of several Hall elements.

With certain applications it happens that the current temporarily raises to far above 100 A (ampere), for example to 1000 A, 1500 A or even 2000 A, whereat these values lie outside the working range. Cause of such a current peak may for example be a short-circuit. For those applications with which the current measurement has to be carried out in a predetermined working range with a predetermined precision and in a predetermined overload range with a reduced precision a solution is suitable with which the Hall element used in the magnetic field sensors is a vertical Hall element or with which an additional vertical Hall element is present because the output signal of a magnetic field sensor with a horizontal Hall element is constant above a predetermined limit current. The reason for this is that the magnetic field concentrators are saturated when the limit current is reached so that the magnetic field flux directed through the horizontal Hall element does no longer increase with increasing current.

With a further embodiment the magnetic field sensitive sensing elements are AMR (anisotropic magnetic resistance) or GMR (giant magnetic resistance) sensors or fluxgate sensors. AMR sensors, GMR sensors as well as fluxgate sensors comprise ferromagnetic materials. These ferromagnetic materials amplify and concentrate the component to be measured of the magnetic field created by the current, i.e. they take over also the function of the magnetic field concentrators of the previous embodiment.

With a further embodiment the magnetic field sensitive sensing elements are vertical Hall elements that are integrated into the active surface of the semiconductor chip. The vertical Hall elements measure directly the component of the magnetic field that runs parallel to the active surface of the semiconductor chip.

The assembly group for current measurement according to the invention has several advantages:

- It consists of only two individual components, namely of the conductor plate and the measuring element.
- The measuring element is very small. The distance between the two magnetic field sensors lies in a range of about 1 bis 3 millimeters. This reduces the sensitivity of the measuring element to an external inhomogeneous magnetic field.
- The mounting of the measuring element on the conductor plate is very simple. It is simply glued at the right position onto the conductor plate. The position accuracy is not very critical.
- The thickness of the conductor plate can be adapted to the working range, it does not play an important role for the measurement.
- By the realization of the whole electronic circuit and of all magnetic field sensitive sensing elements on a single semiconductor chip the variation of the properties of the magnetic field sensitive sensing elements are reduced, the magnetic field sensitive sensing elements always have approximately the same temperature and the distance between the two magnetic field sensors is fix given and remains constant during the lifetime.

The assembly group according to the invention is well suited for the current measurement in electronic hybrid vehicles (HEV), where a brushless DC motor (BLDC motor) is controlled by a high frequency current and currents of typically 200 to 1000 A in the max are to be measured. The current signals are pulse width modulated and therefore require a high bandwidth of the current sensor or a response time in the range of 5-20 microseconds, respectively.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale. In the figures the three directions are designated with x, y and z.

In the Drawings.

DETAILED DESCRIPTION OF THE PREFERRED EMBODIMENTS

Figure 1:
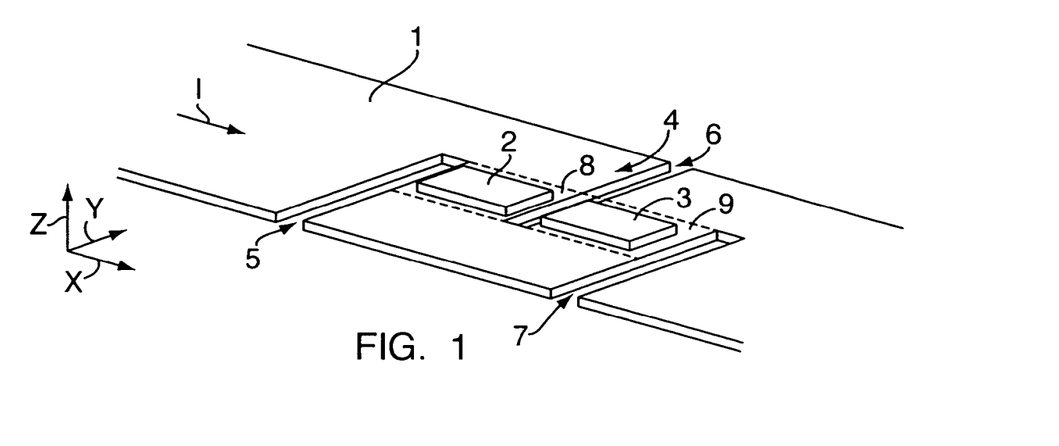
FIG. 1 shows a schematical, three-dimensional representation of an assembly group for current measurement according to the invention.

FIG. 1 shows a schematical, three-dimensional representation of an assembly group for current measurement according to the invention, that is designed for example for a working range from 0 to 200 A. The assembly group comprises a conductor plate 1 in the form of a flat conductor, through which the current I to be measured flows, and a difference sensor 4 formed of two magnetic field sensors 2 and 3. The conductor plate 1 contains three cuts 5, 6 and 7 arranged orthogonally to its longitudinal direction, here the x-direction, so that a first and second conductor section 8 and 9 are formed such that the current direction in the second conductor section 9 runs opposite to the current direction in the first conductor section 8. The borders of the two conductor sections 8 and 9 are illustrated by means of dashed lines. The first magnetic field sensor 2 is arranged on the first conductor section 8 and the second magnetic field sensor 3 is arranged on the second conductor section 9. The two magnetic field sensors 2 and 3 are sensitive to a component of the magnetic field that runs parallel to the surface of the conductor plate 1 and orthogonally to the current direction in the first (and also second) conductor section 8. In the example the two magnetic field sensors 2 and 3 are therefore sensitive to the x-component of the magnetic field. The two magnetic field sensors 2 and 3 are principally identical. The two magnetic field sensors are explained in more detail by means of FIGS. 2 and 3. The assembly group further comprises an electronic circuit for the operation of the difference sensor 4.

For reasons of illustrative clarity an important aspect of the invention is not shown in FIG. 1, namely that the two magnetic field sensors 2 and 3 are integrated into a common semiconductor chip and embedded in a common housing. The assembly group for current measurement according to the invention therefore consists of only two single components, namely the conductor plate 1 and a measuring element, that is mounted on a predetermined position on the conductor plate 1. The measuring element contains a semiconductor chip with magnetic field sensitive sensing elements that is embedded in a conventional technology in a housing. The active surface of the semiconductor chip runs parallel to the surface of the conductor plate 1, on which the measuring element is secured. The magnetic field sensitive sensing elements form the two magnetic field sensors 2 and 3. Advantageously the semiconductor chip also comprises the electronic circuit that operates the two magnetic field sensors 2 and 3 as difference sensor, so that its output signal is proportional to the amplitude of the current I flowing through the conductor plate 1.

The magnetic field sensitive sensing elements are for example AMR or GMR or fluxgate sensors. However, the magnetic field sensitive sensing elements are preferred Hall elements or a combination of Hall elements and magnetic field concentrators. The Hall elements are integrated into the active surface of the semiconductor chip. The magnetic field concentrators are arranged on the active surface of the semiconductor chip. As mentioned in the introduction, one distinguishes between horizontal and vertical Hall elements. A vertical Hall element measures a component aligned parallel to the surface of the semiconductor chip. It is therefore to orient such that it measures the x-component. A horizontal Hall element measures the component of the magnetic field aligned perpendicularly to the active surface of the semiconductor chip, that is here a magnetic field running in the z-direction. Therefore the horizontal Hall element is to place in the area of the edge of a magnetic field concentrator which has the task to turn the magnetic field to be measured running in x-direction locally by 90°, so that it runs in z-direction at the location of the horizontal Hall element.

Along with FIGS. 2 to 6 different examples are presented that illustrate a plurality of possibilities how a magnetic field sensor formed of at least one Hall element and at least one magnetic field concentrator may be made up. There is presented only the magnetic field sensor 2 placed above the first conductor section 8, although the magnetic field sensor 3 placed above the second conductor section 9 is realized in the same way in the same semiconductor chip and embedded into the same housing.

Figure 2:
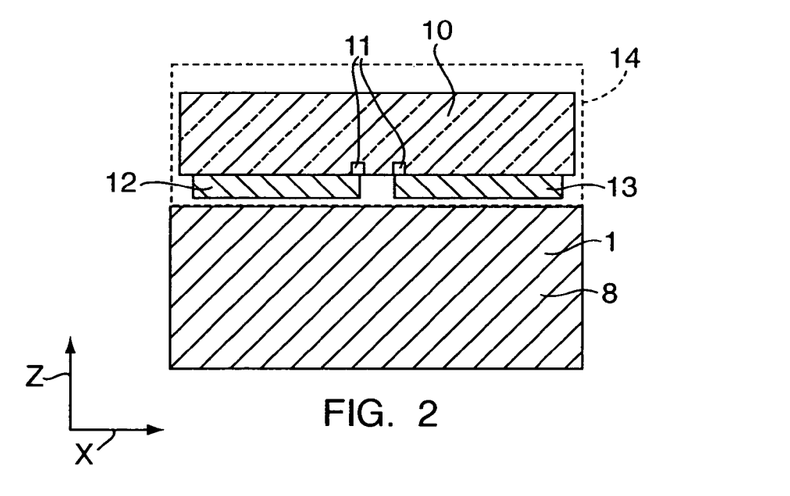
FIG. 2 shows a side view of a magnetic field sensor.
Figure 3:
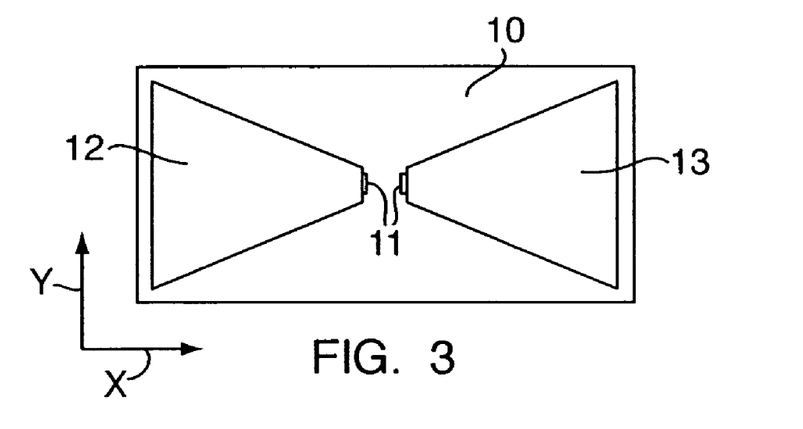
FIG. 3 shows a plan view of the magnetic field sensor, FIG. 4, 5, 6 show a side view of further magnetic field sensors, FIG. 7, 8 show a plan view of magnetic field concentrators, FIG. 9, 10 show further embodiments of the assembly group for current measurement according to the invention.

FIGS. 2 and 3 show a side view of the magnetic field sensor 2 (according to FIG. 1 in y-direction) and a plan view (according to FIG. 1 in negative z-direction). The magnetic field sensor 2 comprises at least one Hall element 11 integrated in a semiconductor chip 10 and two magnetic field concentrators 12 and 13 separated by an air gap and arranged on the semiconductor chip 10. The magnetic field sensor 2 is encapsulated into a housing 14 like a conventional IC. FIG. 2 also shows the conductor section 8 of the conductor plate 1. The Hall element 11 is integrated in the semiconductor chip 10 in the region between the two magnetic field sensors 12 and 13. The Hall element 11 may be a horizontal Hall element that is sensitive to the magnetic field component that runs perpendicularly to the active surface of the semiconductor chip 10, i.e. here the z-component, or it may be a vertical Hall element that is sensitive to the magnetic field component that runs parallel to the active surface of the semiconductor chip 10, i.e. here the x-component. Field lines of the leakage field pass through the Hall element, which are field lines that run outside the air gap from the first magnetic field concentrator 12 to the second magnetic field concentrator 13. These field lines run perpendicularly to the surface of the magnetic field concentrators 12 and 13. A horizontal Hall element has to be arranged below the edge of the magnetic field concentrators 12 or 13 on the side of the edge turned away from the air gap, where as many field lines of the leakage field as possible run in z-direction, whereas a vertical Hall element has to be arranged adjacent the edge of the magnetic field concentrator 12 or 13 in the air gap, where as many field lines of the leakage field as possible run in x-direction. If a horizontal Hall element is used as Hall element, then it is preferred to use two horizontal Hall elements wherein the first Hall element is arranged at the first magnetic field concentrator 12 and the second Hall element at the second magnetic field concentrator 13 so that the field lines of the leakage field pass through the one Hall element in positive z-direction and through the other Hall element in negative z-direction. The two Hall elements are wired such and are operated such that their Hall voltages add to a wanted signal. The Hall element 11 measures thus the component of the external magnetic field running in x-direction and amplified by the magnetic field concentrators 12 and 13. Towards the air gap the two magnetic field concentrators 12 and 13 are preferably formed tapered, so that they collect the magnetic field lines also in y-direction and concentrate them in the air gap at the location of the Hall element 11.

As can be seen from FIG. 1, the conductor plate 1 extends in x-direction. The cuts 5, 6 and 7 extend in y-direction. The magnetic field sensors 2 and 3 are aligned such that the magnetic field concentrators 12 and 13 amplify the component of the magnetic field running x-direction. The current flowing through the first conductor section 8 produces a circular magnetic field $B_1$ that is collected, concentrated and passed through the corresponding Hall element 11 by the magnetic field concentrators 12 and 13 of the first magnetic field sensor 2. The field lines of the magnetic field $B_1$ enter into the magnetic field concentrator 12 and leave the magnetic field concentrator 13, i.e. they run in positive x-direction. The current flowing through the second conductor section 9 produces a circular magnetic field $B_2$ with a rotational direction opposite to the rotational direction of the magnetic field $B_1$, that is also collected, concentrated and passed through the corresponding Hall element 11 by the magnetic field concentrators 12 and 13 of the second magnetic field sensor 3. Here the field lines of the magnetic field $B_2$ enter into the magnetic field concentrator 13 and leave the magnetic field concentrator 12, i.e. they run in negative x-direction. Therefore the output signal of the difference sensor 4 is formed as difference of the output signals of the magnetic field sensors 2 and 3 which is proportional to the difference of the two magnetic fields $B_1$ and $B_2$. The difference sensor 4 thus only measures the magnetic field produced by the current flowing through the conductor plate 1 in the conductor sections 8 and 9, but not the x-component of a possible external interference field.

Because the two magnetic field sensors 2 and 3 measure only the magnetic field that is created by the current I in the first conductor section 8 or second conductor section 9, respectively, the cuts 5, 6 and 7 can be arbitrarily small in x-direction. The ohmic resistance of the conductor plate 1 is therefore only insignificantly increased by the cuts 5, 6 and 7 and the created lost heat is very well dissipated.

Figure 4:
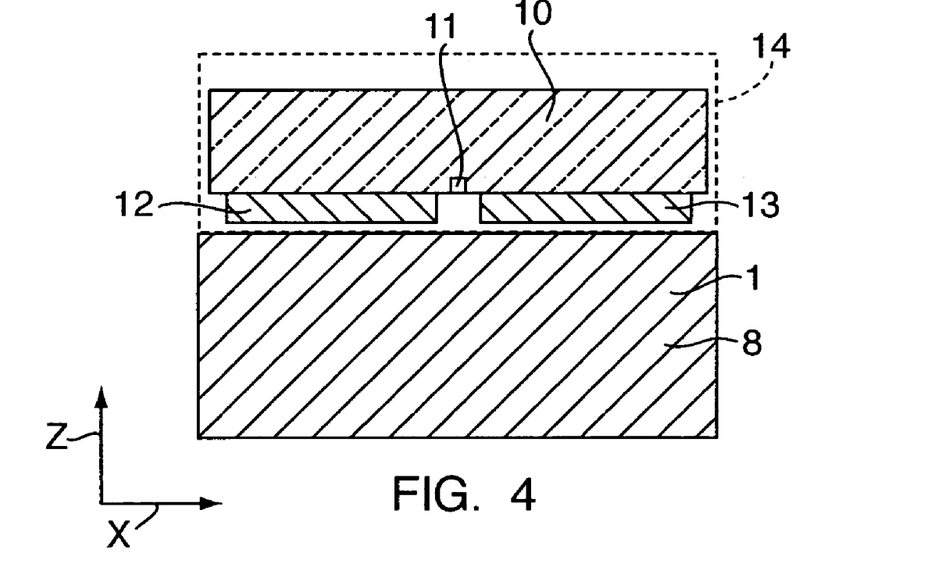

FIG. 4 shows a magnetic field sensor with which a vertical Hall element is used as Hall element 11 that is arranged in the middle between the two magnetic field concentrators 12 and 13.

Figure 5:
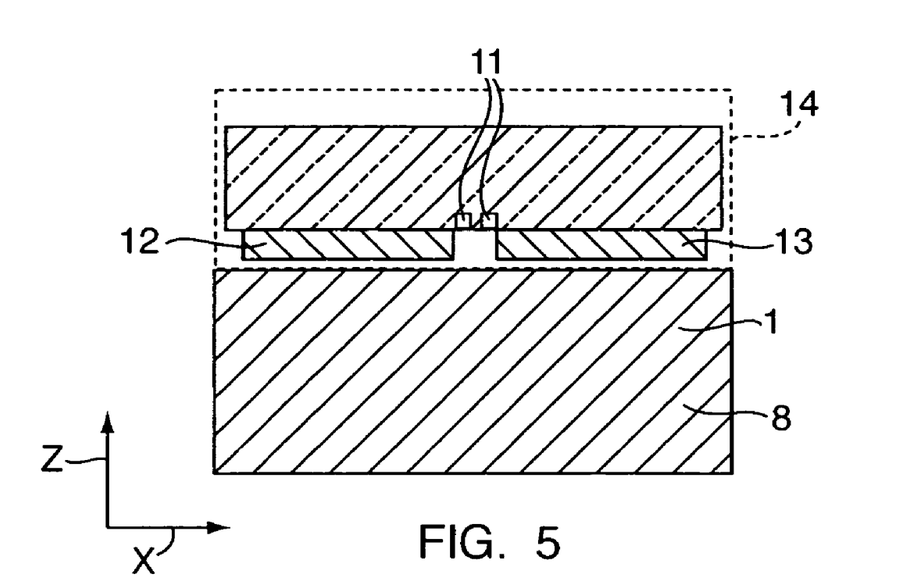

FIG. 5 shows a magnetic field sensor with which two vertical Hall elements are used as Hall element 11 that are arranged between the two magnetic field concentrators 12 and 13. The local interference field passes through the two vertical Hall elements in the same direction.

Figure 6:
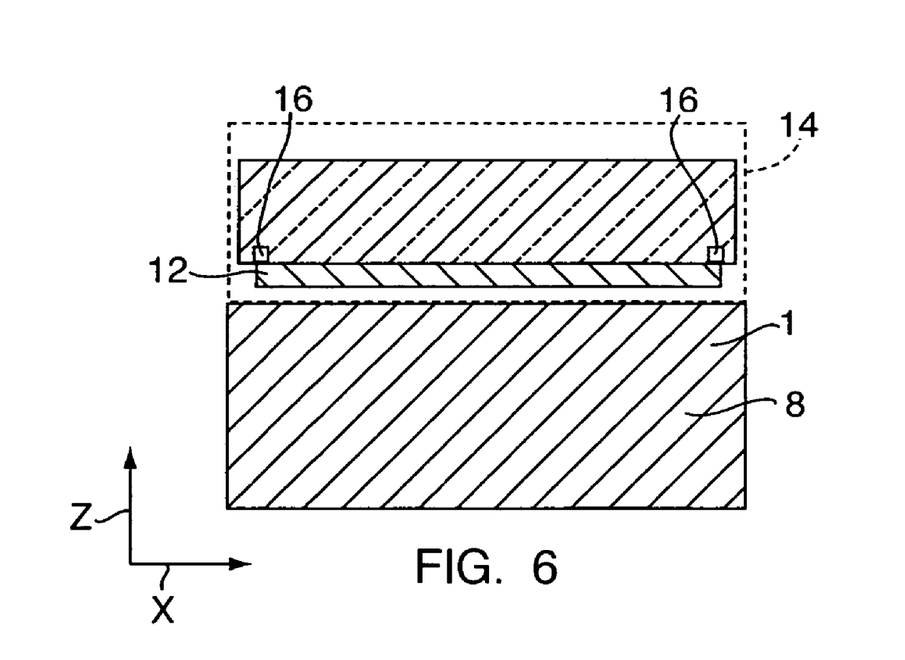

FIG. 6 shows a magnetic field sensor 2 that has only a single magnetic field concentrator 12 and two horizontal Hall elements 16 that are arranged below its edge. The magnetic field lines passing through the two horizontal Hall elements 16 run in positive z-direction at the one Hall element and in negative z-direction at the other Hall element. The difference of the Hall voltages of the two Hall elements is formed as output signal of the magnetic field sensor 2 which is therefore independent from an external magnetic field. Instead of the two horizontal Hall elements 16 at least one vertical Hall element may be provided which, however, has to be arranged adjacent to the edge of the magnetic field concentrator 12.

Figure 7:
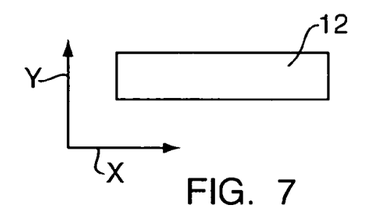
Figure 8:
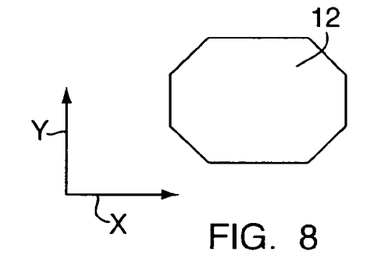

FIGS. 7 and 8 show a plan view of a magnetic field concentrator 12 for the magnetic field sensor according to FIG. 6. The magnetic field concentrator 12 has in one case the form of a rectangle and is in the other case enlarged in the middle in order to collect additional field lines in y-direction and concentrate them at the location of the Hall element 16.

Figure 9:
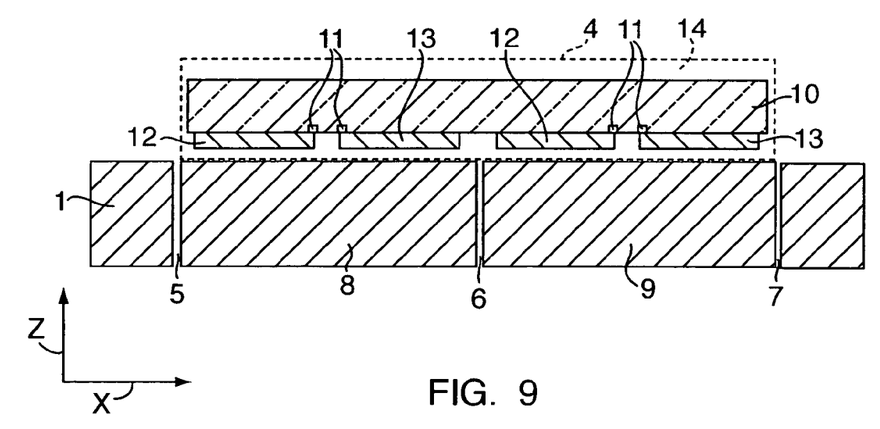

FIG. 9 shows a side view of an embodiment of the assembly group for current measurement according to the invention with which each of the two magnetic field sensors 2 and 3 comprises two magnetic field concentrators 12, 13.

Figure 10:
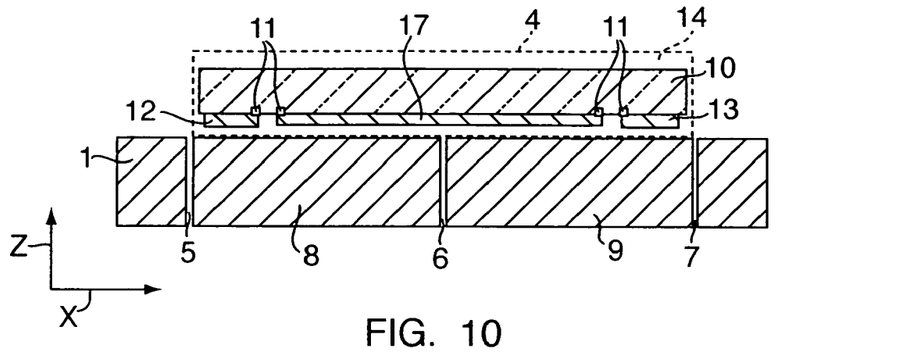

FIG. 10 shows a similar embodiment with which the second magnetic field concentrator of the first magnetic field sensor 2 and the first magnetic field concentrator of the second magnetic field sensor 3 are replaced by a single magnetic field concentrator 17, i.e. they are combined to the single magnetic field concentrator 17.

Figure 11:
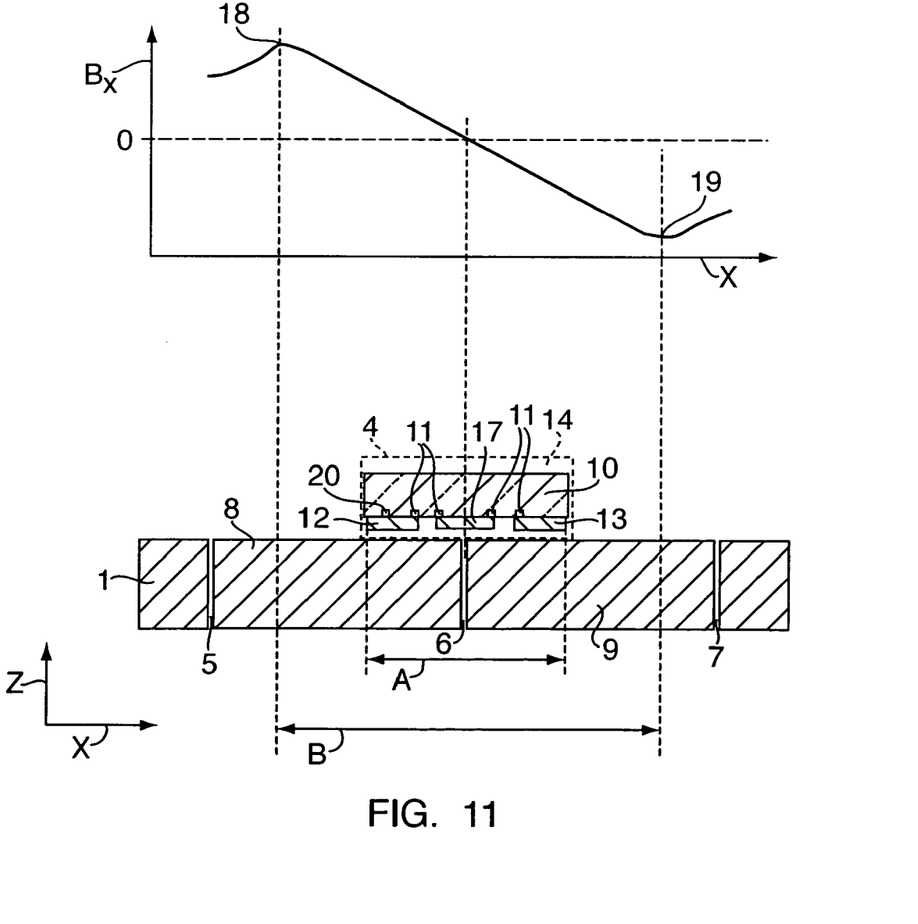
FIG. 11 shows a diagram and a further embodiment of the assembly group for current measurement according to the invention.

FIG. 11 shows a diagram and an assembly group for current measurement. The diagram illustrates the run of the x-component $B_x$ of the magnetic field at the height of the magnetic field concentrators 12, 13 or 17, respectively, above the two conductor sections 8 and 9, but in the absence of the magnetic field concentrators 12, 13 or 17. The magnetic field is created by the current flowing through the conductor sections 8 and 9. The x-component $B_x$ is symmetrical with regard to the center of the cut 6, where it changes the sign, and has a positive extremum 18 and a negative extremum 19. The distance between the two extrema 18 and 19 amounts to B. Between the two extrema 18 and 19 there exists a region where the progression of the x-component $B_x$ is approximately linear.

The assembly group for current measurement of FIG. 11 distinguishes in that the magnetic field concentrators 12, 13 or 17 are shorter than with the previous examples. The distance A between the outer ends of the two magnetic field concentrators 12 and 13 of the difference sensor 4 that are farthest apart from each other is about the same size or shorter than the distance B. This solution is particularly robust against unavoidable mounting tolerances and symptoms of old age which may appear in the perennial operation of such an assembly group for current measurement because displacements of the difference sensor 4 in x-direction do, within predetermined tolerance limits, not lead to a change or only to a negligible change of the output signal. While the difference sensor 4 of FIG. 10 is designed for maximal sensitivity, the difference sensor 4 of FIG. 11 is designed for greater robustness against mounting tolerances, but at the cost of reduced sensitivity.

As mentioned in the introduction it happens with certain applications that the current temporarily raises to far above 100 A, for example to 1000 A, 1500 A or even 2000 A. For such applications the Hall element 11 used in the magnetic field sensors 2 and 3 is advantageously a vertical Hall element or an additional vertical Hall element is present. With the embodiment of FIG. 11 the Hall elements that measure the magnetic field turned by the magnetic field concentrators 12, 17 and 13 are horizontal Hall elements. Additionally a vertical Hall element 20 is present that has to deliver a signal particularly then when the output signal of the horizontal Hall elements does no longer increase with increasing current because the magnetic field concentrators 12, 17 and 13 are partially or completely magnetically saturated. It suffices if at least one of the two magnetic field sensors 2 and 3 comprises a vertical Hall element. The vertical Hall element 20 can principally be placed anywhere where the x-component $B_x$ of the magnetic field produced by the current is sufficiently big, be it in the region of the edge of a magnetic field concentrator where the turned field lines run already again approximately in x-direction, or anywhere below the magnetic field concentrator or even anywhere apart the magnetic field concentrator. The contribution of the vertical Hall element 20 to the measuring signal is different according to its position. If only one single vertical Hall element 20 is present, then the measurement in the overload region includes also a possible x-component of a magnetic interference field, which, however, as a rule is small compared to the magnetic field to be measured. In order to avoid this two vertical Hall elements may be present wherein the first vertical Hall element is placed in the region of the first conductor section 8 and the second vertical Hall element in the region of the second conductor section 9 and wherein the two vertical Hall elements are connected as difference sensor.

With all embodiments the component of the magnetic field to be measured runs parallel to the flat surface of the conductor plate 1 and therefore also parallel to the active surface of the semiconductor chip 10.

The embodiments presented above represent a preferred solution because all magnetic field sensitive sensing elements are housed on a single semiconductor chip and this semiconductor chip is encapsulated into a single housing. The measuring element delivers an output signal that is proportional to the difference of the output signals of the two magnetic field sensors 2 and 3. This solution is particularly simple and therefore economic. However, there are applications that demand additional requirements which are not fulfilled by this solution. One such requirement is that the measuring element has a certain redundance so that a useful measuring signal is delivered also when disturbances occur. So, for example, a requirement may be that the two magnetic field sensors 2 and 3 are galvanically separated. In order to fulfill these requirements, there are two alternative possibilities:

1. The two magnetic field sensors 2 and 3 are realized on two separated semiconductor chips which, however, are embedded in the same housing. The output signals of the two magnetic field sensors are delivered via two terminals to the outside and further processed by an interface circuit.

2. The two magnetic field sensors 2 and 3 are realized on two separated semiconductor chips which are each encapsulated in a separate housing, for example a SO-8, SO-16, SOIC, DIL or any other standard package. The two housings are mounted on a printed circuit board or another carrier and form thus the measuring element.

With these solutions the distance between the two magnetic field sensors may be a little bit bigger and amount to up to 10 millimeters.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

The invention claimed is:

1. An assembly group for current measurement, consisting of:
   a conductor plate and
   a measuring element;
   the conductor plate having a flat surface with three cuts wherein the first and third cut start from a first edge of the conductor plate and wherein the second cut starts from an opposing second edge of the conductor plate and is arranged between the first and third cut, so that a first and a second conductor section are formed in the conductor plate wherein a current direction in the second conductor section is opposite to a current direction in the first conductor section,
   the measuring element having a first and a second magnetic field sensor that are sensitive to a component of the magnetic field that runs parallel to the flat surface of the conductor plate and perpendicularly to the current direction in the first conductor section, wherein the first and the second magnetic field sensor comprise magnetic field sensing elements that are formed in at least one semiconductor chip, that comprise a ferromagnetic material located on an active surface of the at least one semiconductor chip and that are encapsulated in a same housing or in separate housings, the at least one semiconductor chip comprising electronic circuitry for the operation of the magnetic field sensitive sensing elements,
   wherein the measuring element is placed on the flat surface of the conductor plate in such a way that the first magnetic field sensor is located above the first conductor section and the second magnetic field sensor above the second conductor section.

2. The assembly group according to claim 1, wherein the ferromagnetic material of each magnetic field sensitive sensing element forms two magnetic field concentrators separated by a gap and wherein at least one Hall element is integrated into the active surface of the at least one semiconductor chip in the area of the gap or adjacent to the gap, the assembly group having no magnetic material in the cuts and having no magnetic material arranged on the flat surface of the conductor plate lying opposite to the flat surface of the conductor plate with the measuring element.

3. The assembly group according to claim 2, wherein the at least one semiconductor chip is a single semiconductor chip, wherein the number of the magnetic field concentrators is three, wherein the three magnetic field concentrators are arranged along a straight line and wherein the middle magnetic field concentrator is a common magnetic field concentrator for both magnetic field sensitive sensing elements.

4. The assembly group according to claim 3, wherein the current flowing through the conductor plate produces a magnetic field with which said component that runs parallel to the surface of the conductor plate and perpendicular to the current direction in the first conductor section has in the absence of the magnetic field concentrators two extrema lying in a distance B from each other, wherein a distance between the outer ends of the two magnetic field concentrators that are farthest apart from each other is about the same size or shorter than the distance B.

5. The assembly group according to claim 2, wherein the current flowing through the conductor plate produces a magnetic field with which said component that runs parallel to the surface of the conductor plate and perpendicular to the current direction in the first conductor section has in the absence of the magnetic field concentrators two extrema lying in a distance B from each other, wherein a distance between the outer ends of the two magnetic field concentrators that are farthest apart from each other is about the same size or shorter than the distance B.

6. The assembly group according to claim 1, wherein the magnetic field sensitive sensing elements are vertical Hall elements integrated in an active surface of the at least one semiconductor chip.

7. The assembly group according to claim 1 wherein the magnetic field sensitive sensing elements are either AMR or GMR or fluxgate sensors.

8. Measuring element for current measurement for the assembly group according to claim 1, the measuring element having two magnetic field sensors formed of magnetic field sensitive sensing elements that are formed in at least one semiconductor chip wherein both magnetic field sensors are sensitive to a same component of the magnetic field that runs parallel to an active surface of the at least one semiconductor chip.

9. Measuring element according to claim 8, wherein the magnetic field sensitive sensing elements comprise magnetic field concentrators placed on an active surface of the at least one semiconductor chip and Hall elements integrated into the active surface of the at least one semiconductor chip wherein the magnetic field concentrators serve for the amplification and concentration of said component of the magnetic field at the location of the Hall elements.

10. Measuring element according to claim 9, wherein the at least one semiconductor chip is a single semiconductor chip, wherein the number of the magnetic field concentrators is three, wherein the three magnetic field concentrators are arranged along a straight line and wherein the middle magnetic field concentrator is a common magnetic field concentrator for both magnetic field sensors.

11. Measuring element according to claim 10, wherein the current flowing through the conductor plate produces a magnetic field with which said component that runs parallel to the surface of the conductor plate and perpendicular to the current direction in the first conductor section has in the absence of the magnetic field concentrators two extrema lying in a distance B from each other, wherein a distance between the outer ends of the two magnetic field concentrators that are farthest apart from each other is about the same size or shorter than the distance B.

12. Measuring element according to claim 9, wherein the current flowing through the conductor plate produces a magnetic field with which said component that runs parallel to the surface of the conductor plate and perpendicular to the current direction in the first conductor section has in the absence of the magnetic field concentrators two extrema lying in a distance B from each other, wherein a distance between the outer ends of the two magnetic field concentrators that are farthest apart from each other is about the same size or shorter than the distance B.

13. Measuring element according to claim 8, wherein the magnetic field sensitive sensing elements are vertical Hall elements integrated in an active surface of the at least one semiconductor chip.

14. Measuring element according to claim 8 wherein the magnetic field sensitive sensing elements are either AMR or GMR or fluxgate sensors.

* * * * *